United States Patent [19]

Daly

[11] 4,316,074

[45] Feb. 16, 1982

[54] METHOD AND APPARATUS FOR LASER IRRADIATING SEMICONDUCTOR MATERIAL

[75] Inventor: Richard T. Daly, Huntington, N.Y.

[73] Assignee: Quantronix Corporation, Smithtown, N.Y.

[21] Appl. No.: 971,515

[22] Filed: Dec. 20, 1978

[51] Int. Cl.³ .............................................. B23K 27/00
[52] U.S. Cl. ........................ 219/121 L; 219/121 LM; 219/121 LE; 219/121 LF; 219/121 LB; 219/121 LT
[58] Field of Search .... 219/121 L, 121 LM, 121 EM, 219/121 LE, 121 LF, 121 LH, 121 LJ, 121 LP, 121 LR, 121 LT, 121 LU, 121 LY, 121 EJ, 121 E, 121 LG, 121 LL; 346/76 L; 29/576 B, 576 E, 584, 585; 350/170, 173, 6.1, 6.4

[56] References Cited

U.S. PATENT DOCUMENTS

| 3,404,254 | 10/1968 | Jones .............................. 219/121 EJ |
| 3,420,719 | 1/1969 | Potts ............................. 219/121 LM |
| 3,518,925 | 7/1970 | Chitayat ......................... 219/121 L |
| 3,622,742 | 11/1971 | Cohen et al. .................. 219/121 LH |
| 3,663,795 | 5/1972 | Myer ............................ 219/121 LJ X |
| 3,844,638 | 10/1974 | Lingenfelder et al. .......... 350/173 X |
| 4,015,100 | 3/1977 | Gnanamuthu et al. ...... 219/121 LM |
| 4,038,663 | 7/1977 | Day et al. ................... 219/121 LJ X |
| 4,079,230 | 3/1978 | Miyauch et al. ................ 219/121 L |
| 4,081,654 | 3/1978 | Mracek ......................... 219/121 LM |
| 4,110,594 | 8/1978 | May ............................. 219/121 LM |
| 4,128,752 | 12/1978 | Gravel ........................ 219/121 LP X |
| 4,131,487 | 12/1978 | Pearce et al. .............. 219/121 LM X |
| 4,131,782 | 12/1978 | Einstein et al. ............... 219/121 LL |
| 4,144,180 | 9/1978 | Kayanuma .................... 346/76 L X |
| 4,151,008 | 4/1979 | Kirkpatrick ............. 219/121 LM X |
| 4,154,625 | 5/1978 | Golovchenko et al. .... 219/121 L X |

OTHER PUBLICATIONS

Kachurin et al., "Annealing of Implanted Layers by a Scanning Laser Beam", Sov. Phys. Semicond., vol. 10, No. 10, Oct. 1976, pp. 1128-1129.

Arrabito et al., "Laser Perforation Technique", IBM Tech. Disc. Bull., vol. 13, No. 10, Mar. 1971, p. 3098.

Aeschlimann et al., "Automated Welding of Minute Parts", Laser Focus, vol. 12, No. 3, pp. 33-36, Mar. 1976.

Lever, "Background Heating for Laser Annealing", IBM Tech. Disc. Bull., vol. 21, No. 10, Mar. 1979, p. 4040.

Hovel, "Laser Annealing and Diffusion Definition Using Metal Layers", IBM Tech. Disc. Bull., vol. 21, No. 10, Mar. 1979, p. 4285.

Primary Examiner—C. L. Albritton
Attorney, Agent, or Firm—Kane, Dalsimer, Kane, Sullivan & Kurucz

[57] ABSTRACT

A laser system is disclosed for facilitating transient surface heating and/or melting and regrowth of amorphous, polycrystalline or imperfect crystalline semiconductor wafer material. This system also has specific application to gettering of impurities and the annealing-out of defects within a semiconductor wafer. In the system, a number of circular target-wafers are arranged around the periphery of a turntable. The turntable rotates while a simple, slow-moving beam-delivery system moves radially with respect to the turntable delivering a helical scan which may also be in the form of a multiple-track. Use of the turntable with a multiple wafer load allows efficient batch-processing. Blocking masks may be employed when it is desired to irradiate only selected areas of the semiconductor substrates.

28 Claims, 9 Drawing Figures

TEMPERATURE DISTRIBUTION vs DEPTH INTO WAFER FOR $LI^2A$

METHOD AND APPARATUS FOR LASER IRRADIATING SEMICONDUCTOR MATERIAL

BACKGROUND OF THE INVENTION

The field of the invention relates to the transient heating and regrowth of thin layers of semiconductor material and more particularly to laser-scanning systems for surface heating and annealing, for example, of ion-implantation damage in semiconductor material.

The process of ion implantation is a technique used in the fabrication of a wide range of semiconductor devices from simple P-N junction solar cells to complicated LSI integrated circuits. During the process of implantation, numerous defects are created in the surface of the wafer necessitating a subsequent annealing process to provide the crystalline structure necessary for the proper electronic performance. This annealing has typically been performed via high temperature baking in ovens for sufficiently long time periods to allow various ions to migrate to lattice sites.

However, this thermal annealing has several drawbacks among which are: (1) the long exposure at high temperatures may result in migration of the implanted ions resulting in less than optimum junction characteristics; (2) during this long time period defects tend to be produced especially due to contamination; (3) minority carrier lifetimes are reduced in the underlying material since heating is essentially uniform throughout the wafer thickness.

Recently an alternative technique for ion-implantation annealing has been investigated. This technique utilizes high-intensity laser radiation to provide surface heating of implanted wafers thereby permitting localized annealing in very short time periods; it has been termed laser ion implantation annealing. As a result of the extremely short irradiation times (typically fractions of a microsecond), the problems of dopant migration, contamination and lifetime reduction may be greatly reduced by this technique.

Early experiments with short-pulse laser radiation demonstrated the ability to provide localized surface heating and thereby produce special effects. F. E. Harper and M. I. Cohen, Solid State Electronics 13 1103 (1970). Further efforts were limited at that time by the availability of lasers with precisely controllable, stable spatial and temporal beam distributions. In 1975, a number of Russian workers demonstrated the potential salubrious effects of laser ion implantation annealing. G. A. Kachurin, N. B. Pridachin and L. S. Smirnov, Sov. Phys., Semicond 9, 946 (1976); E. I. Sktyrkov, I. B. Khaibullin, M. M. Zaripov, M. F. Galyatudinov and R. M. Bayazitov, Sov. Phys., Semicond. 9, 1309 (1976) and references included therein; O. G. Kutukova and L. N. Streltsov, Sov. Phys., Semicond. 10, 265 (1976) as well as many other references. This work was performed primarily with radiation from pulsed ruby lasers and yielded "satisfactory electrical properties without deterioration of the properties of the underlying material". (O. G. Kutukova and L. N. Streltsov, Sov. Phys., Semicond. 10, 265 (1976).)

The process of laser ion implantation annealing is based on thermal physics: That is, the heating of a surface by absorption of electromagnetic radiation and subsequent melting and recrystallization. In order that only a thin surface layer be melted, it is essential that: (1) the absorption coefficient, $\alpha$ at the radiation wavelength be large so that all heating takes place near the surface and, (2) that pulses be very short so that minimal thermal diffusion takes place.

For the sake of the following analysis, it will be assumed that $\alpha$ is $10^4$ cm$^{-1}$ or greater (a value achievable at appropriate wavelengths and temperatures for most semiconductor materials). (At 1400° C. the absorption coefficient of silicon for 1.06 $\mu$m radiation is $1.7 \times 10^4$ cm$^{-1}$, at shorter wavelengths it is substantially larger.) Under this condition, a distributed heat source has an exponential distribution with respect to depth into the wafer.

$$H = \frac{2P}{\pi \omega^2 (1-R)} \alpha e^{-\alpha x} = I_o \alpha e^{-\alpha x} \quad (1)$$

where H is the heat absorbed per unit volume;
R is the surface reflectivity;
P is the total incident power;
$\omega$ is the 1/e$^2$ beam radius;
$I_o$ is the effective surface power density.

If the laser beam diameter is large compared to the thermal depth, $\delta$, ($\delta = [k\tau]^{\frac{1}{2}}$, where k is the thermal diffusivity and $\tau$ the pulse width) then the heat flow may be treated as a one-dimensional problem. The resulting temperature distribution can be obtained using the procedures of Carslaw and Jaeger. H. S. Carslaw and J. C. Jaeger "Conduction of Heat in Solids" Oxford University Press, 1959.

$$T = \frac{I_o}{K} \left\{ 2\delta \, ierfc\left(\frac{\alpha x}{2\delta}\right) - \frac{\exp(-\alpha x)}{\alpha} + \frac{\exp[(\alpha\delta)^2 - \alpha x]}{2\alpha} erfc\left[\alpha\delta - \frac{x}{2\delta}\right] + \frac{\exp[(\alpha\delta)^2 + \alpha x]}{2\alpha} erfc\left[\alpha\delta + \frac{x}{2\delta}\right] \right\} \quad (2)$$

where K is the thermal conductivity. At the surface $$T_s = \frac{I_o \delta}{K} \left\{ \frac{2}{\sqrt{\pi}} - \frac{1}{\alpha\delta} + \frac{\exp(\alpha\delta)^2}{\alpha\delta} erfc(\alpha\delta) \right\}$$

The normalized temperature $\textcircled{H} = (KT)/I_o\Gamma)$ is plotted in FIG. 7; over a large range of $\alpha\delta$ the function can be approximated by $[1-\exp(-\alpha\delta)]$, so that $$T_s \approx \frac{I_o \delta}{K} [1 - \exp(-\alpha\delta)] \quad (4)$$

For a typical value of $\alpha\delta \sim 1$ the temperature is approximately $0.6 I_o\delta/K$. Using values for silicon, the calculated threshold to heat the surface to the melting point, $T_m$, therefore is $$I_o = \frac{KT_m}{.6\delta} = \frac{.13 \times 1.4 \times 10^3}{.6 \times 10^{-4}} = 3 \times 10^6 \, watts/cm^2$$

where $\delta = \sqrt{kt} = (0.075 \times 1.35 \times 10^{-7})^{\frac{1}{2}} \approx 10^{-4}$ Since the reflectivity is 30%, the required incident power density is $4.3 \times 10^6$ watts/cm$^2$ and the threshold energy density, $E_t = (I_o T/(R)$, is 0.6 J/cm$^2$; this is in close agreement with measured values of about 1 J/cm$^2$. The difference is due to the fact that it is necessary to melt to a depth of about 1 micrometer and to supply the heat of fusion, as will be calculated next.

The temperature as a function of depth into the wafer given by equation (2) can be rewritten in terms of normalized variables as, $$H = 2 \, ierfc \frac{z}{2y} - \frac{\exp(-z)}{y} + \frac{\exp(y^2 - z)}{2y} \, erfc \left( y - \frac{z}{2y} \right) + \frac{\exp(y^2 + z)}{2y} \, erfc \left( y + \frac{z}{2y} \right) \quad (5)$$

where $z = \alpha x$, $y = \alpha \delta$.

A plot of this function is shown in FIG. 8.

At a normalized depth of unity ($\alpha x = 1$), the temperature is approximately 70% of the surface temperature; therefore, if the threshold energy is defined as being that required to raise the temperature at this depth to the melting point, $I_o$ must be increased by about 1.4 times.

Finally, in order to melt, it is necessary to supply the heat of fusion to the annealed volume. The required energy density, $E_f$, for this is, $$E_f = \frac{\rho \alpha L}{(1 - R)[1 - \exp(-\alpha x)]} \quad (6)$$

where $\rho$ is the density of the material and
L is the heat of fusion.

Using values for silicon, at a depth of 1 micrometer again, it is found that, $$E_f = \frac{2.4 \times 10^{-4} \times 1.4 \times 10^3}{.7 \times .63} = .75 \, J/cm^2$$

Thus, the incident energy density required for annealing $E_A$, is of the order of $0.6 \times 1.4 + 0.75 = 1.6 \, J/cm^2$.

Other semiconductor preparatory processes involving transient surface heating, such as conversion of an amorphous surface layer to poly- or single crystal layers or conversion of poly crystal to single crystal or conversion of surface poly crystal grain size may be carried out in similar fashion to that described above. In some of these processes melting may not be required.

SUMMARY OF THE INVENTION

A principal object of the present invention is to provide a laser system for permitting the attainment of transient heated (including molten) conditions in the surface of a semiconductor wafer such as silicon and then permitting epitaxial or polycrystal regrowth.

Another object is to provide a system of the foregoing type in which nucleated or oriented regrowth of crystalline material is obtained by a laser system which operates to melt to a sufficient depth the original amorphous, polycrystalline, or defect-containing exposed surface layer in order to nucleate the epitaxial regrowth on the underlying crystal substrate or to provide conditions for regrowth of the original layer into polycrystalline material of larger grain size.

It is a further object of the invention to provide a laser system for the annealing of ion-implantation damage in semiconductor material.

Still another object of the invention is to provide a system which allows batch processing of silicon wafers.

Still another object is to provide a system which allows photomasking or stencil masking such that the laser irradiates only selected parts of the wafer surface.

These and other objectives are accomplished by a laser system comprising a pulsed laser, a rotating turntable upon which silicon wafers are placed, and other necessary optical components. In this connection the beam passes through a partially transmitting mirror and is fed to a monitoring system having feedback means for stabilizing the power of the laser. The reflected portion enters a roof or dove prism and passes through a beam expander. A right-angle prism causes the beam from the expander to be directed to the substrate through a focusing lens. The silicon wafer substrate is positioned upon a rotatable turntable which is capable of holding a number of such wafers.

A Neodymium-doped Yttrium Aluminum Garnet (Nd:Yag) laser is the preferred laser type for this application. This laser can be operated for example in the CW-pumped, Q-switched configuration to produce radiation pulses of favorable duration (approximately 100 to 1000 nanoseconds) with average power outputs for required process throughput rates. Since pulse-to-pulse stability is important in this process, and since this stability increases as pulsing frequency decreases it is important to operate at the lowest pulsing frequency consistent with maintenance of a satisfactory average power laser output. In the Yag laser, pulsing rates below about 10 Khz result in significant average power decrease, above about 10 Khz stability decreases. For a suitable basic reference for laser modes, q-switching, etc. reference is made to Solid-State Laser Engineering, W. Koechner, Springer-Verlag New York, Heidelberg, Berlin, 1976.

The present invention envisions the utilization of a very high spacial beam-mode operation of the laser at relatively high total beam power output. In order to obtain the optimum pulse spacial profile for melting but not boiling the work piece surface, a cone homogenizer may be effectively incorporated into the system along with a relatively wide angle lens of conventional design. Alternatively, where a high-quality, well-focused laser beam is desired, the fundamental mode may be employed where laser beam-power is not a limiting factor in the work process. Examples are cases where a relatively small area or section of the surface of the wafer in the form of a well-defined geometrical pattern, is required to be exposed to the laser beam. Here, the homogenizer plus the wide angle lens are not required.

In wafer fabrication, gettering on the back side of the wafer can serve to trap impurities present in the wafer. This becomes increasingly important where the price of the virgin wafer is proportional to its purity. Thus, it would be desirable to purchase relatively impure wafers and use a "gettering" process to trap and isolate the impurities. Needless to say, during normal processing of silicon wafers, impurities are inevitably introduced. The act of gettering would serve to immobilize, trap or otherwise isolate these impurities on the back side of the wafer. However, to effectively getter, a relatively small laser spot is preferred, namely approximately 1 mil in diameter. In addition, the pulse must be relatively stable. In such applications, it has been determined that a 10 Khz Yag laser pulsing frequency provides the stable pulse for such application. Under these circumstances, it has been found that the pulse of this laser must be split to provide a plurality of spots which must be staggered.

For such purposes a beam splitter and delta prism must be incorporated into the optical system.

In operation, the spots are overlapped circumferentially and radially. A Yag laser is used so that the pulse rate can be reduced while peak pulse power is simultaneously increased. In operation, the laser pulsing frequency is constant and the radial spots move inwardly as the turntable rotates. This radial motion may be accomplished by movement of the right angle prism and focusing lens. To provide uniform annealing, the linear speed, L, of the spots relative to the workpiece must be constant. Since the linear speed is equal to the radial distance, R, multiplied by the angular speed, $\omega$, of the rotating turntable ($L=R\omega$), the angular speed must be increased as the radius decreases to keep overlap constant. The laser scanning system utilizes a rotating fast axis scan and a motor driven beam delivery optical system to provide the slow, radial, orthogonal axis.

The laser system may easily be modified to permit the irradiation of only selected areas of the semiconductor substrates. A set of blocking masks are placed either in contact with or in close proximity to the semiconductor wafer surfaces. The stencil-like masks block the passage of the beam except within those transmitting areas corresponding to the portions of the wafer surface desired to be irradiated.

The present invention also envisions the application of an amorphous layer onto a wafer of host crystalline material as for example by a vapor deposition technique. The layer and host material of the wafer may both be silicon. Thereafter, the amorphous layer can be transformed to the crystallinity of the base material by obtaining a transient molten condition which must penetrate down into the base of host crystalline material of the wafer so that epitaxial regrowth may be obtained.

A single and economical configuration for use with multimode lasers is provided by the invention. It is adaptable to a production environment since it employs batch loading of wafers, and is very reliable.

BRIEF DESCRIPTION OF THE DRAWINGS

FIG. 2b is a schematic perspective view of the components of a laser annealing system of FIG. 2a.

DESCRIPTION OF THE INVENTION

Figure 1:
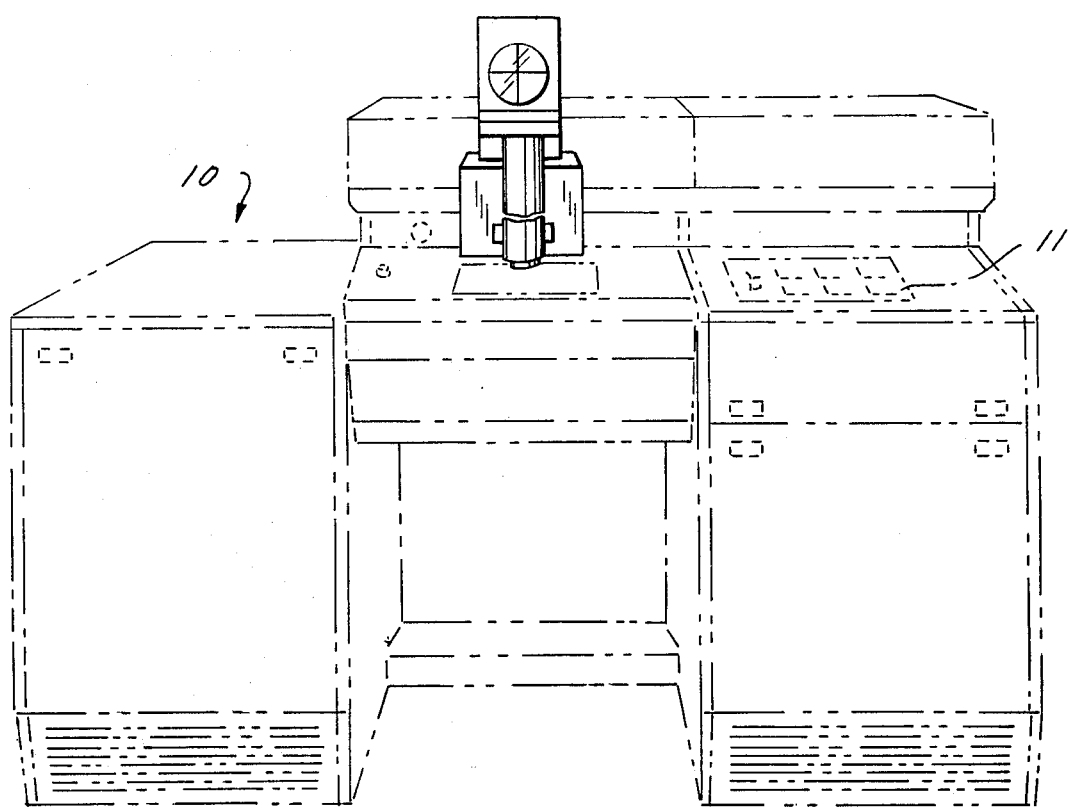
FIG. 1 is a perspective view of a free-standing enclosure suitable for housing a laser system for annealing semiconductor substrates.

The laser annealing system may be housed within a free-standing enclosure 10 as shown in FIG. 1. A representative enclosure, Quantronix Model 603, may be obtained from Quantronix Corporation located in Smithtown, N.Y. The system is shown in detail in FIGS. 3 and 4, and schematically represented in FIG. 2.

The enclosure contains a laser assembly including a laser with power supply and cooler, a beamsplitter and collimating optics. It also houses means for providing beam motion, a rotating table and wafer plattens, a microprocessor system controller, control/display panel 11, and a laser power monitor part.

Figure 2A:
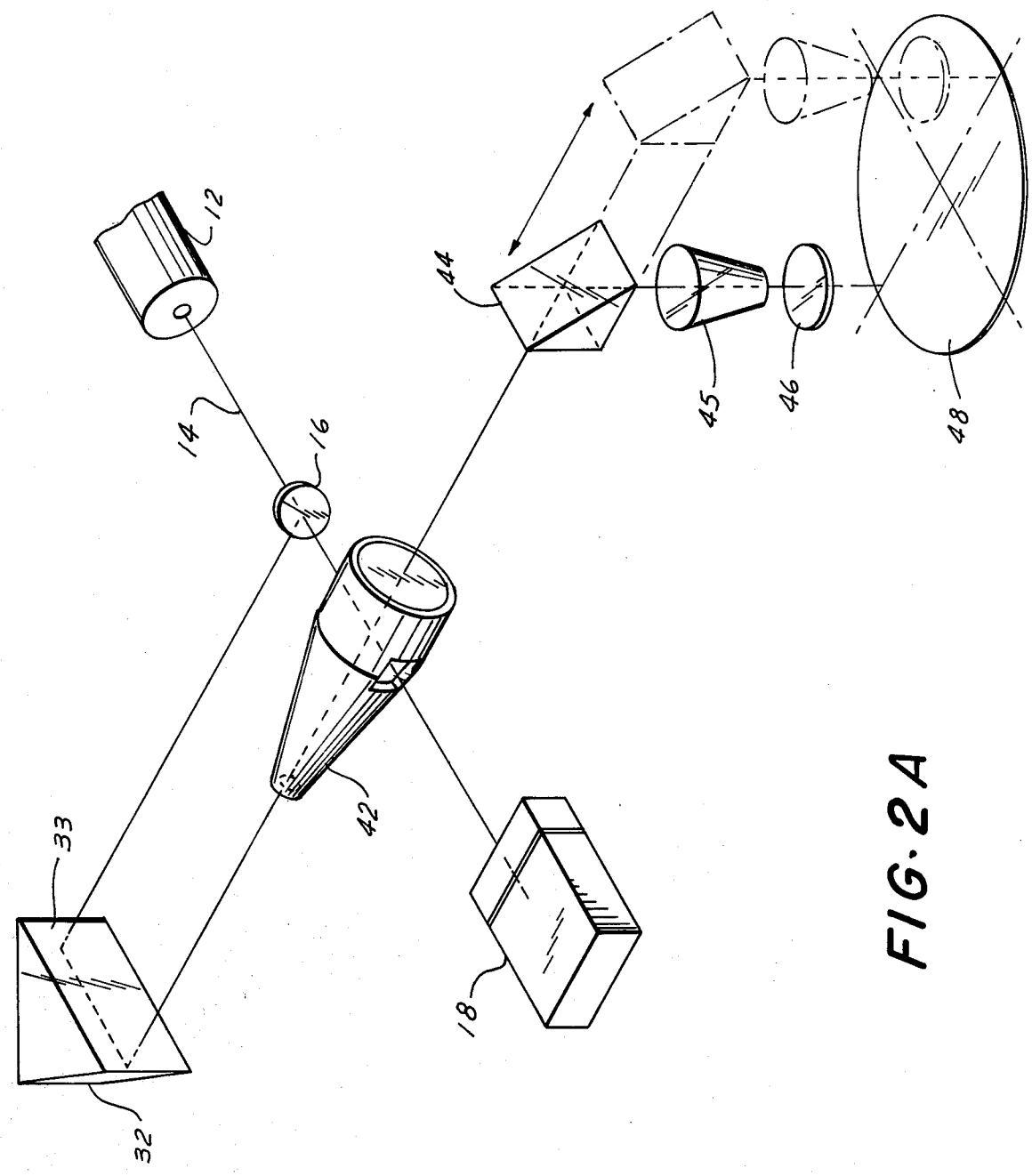
FIG. 2a is a diagrammatic plan view of a successful laser annealing system.
Figure 2B:
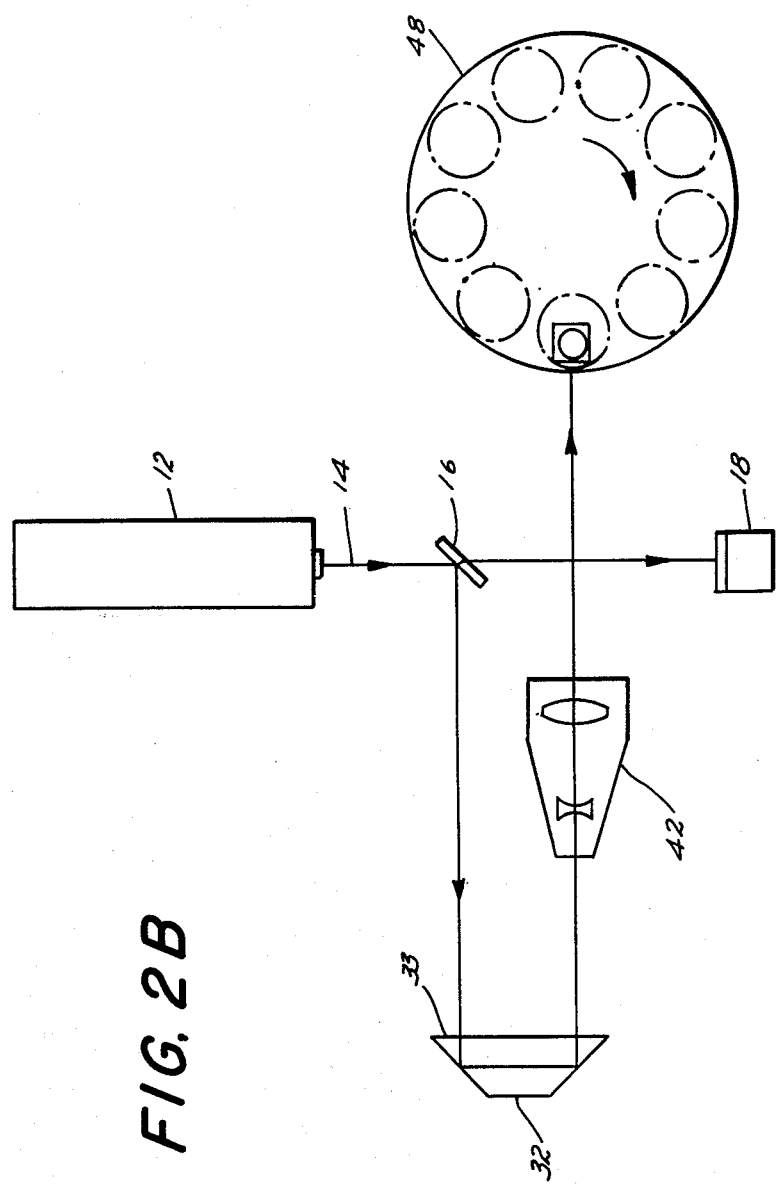
Figure 3:
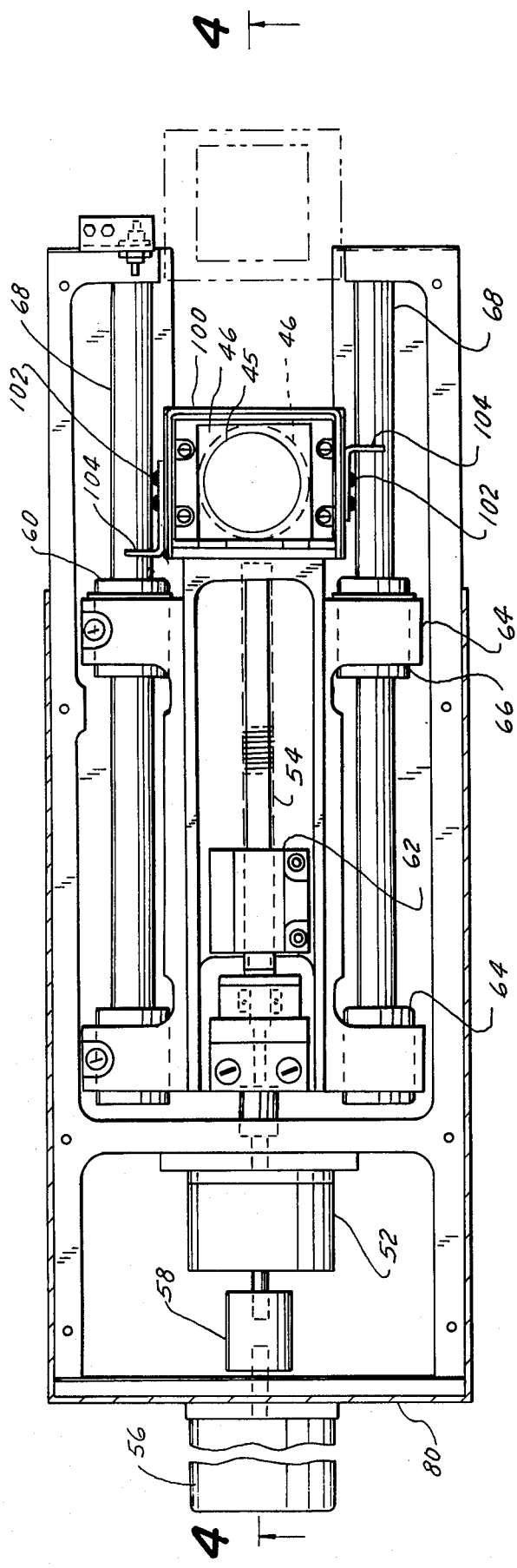
FIG. 3 is a sectional view of a laser annealing system taken along line 3—3 of FIG. 4.

The optical system employed in the wafer annealing machine schematically shown in FIGS. 2a and 2b utilized a model 116S Yag laser available from Quantronix Corporation. The laser, optics and rotating platten are installed in the Model 603 Console available from the Quantronix Corporation. A variable speed turntable coupled with a variable speed radial arm provide the required laser dot spacing.

The CW-pumped repetitively Q-switched Nd:Yag laser provides an ideal source of radiation because of its absorption by silicon, temporal and spatial beam stability, high average power and ability to generate short pulses. With the presently available 15 watts $TEM_{00}$ mode, an annealing rate of approximately 1 cm$^2$ per second is feasible.

The Yag laser also offers the possibility of substantially high average power in other than $TEM_{00}$ mode operation. In this case, care must be taken to assure that complete coverage of the wafer surfaces is obtained either by the appropriate overlap or by beam-smoothing optical techniques. Powers of several hundreds of watts are available leading to potential annealing rates in excess of 10 cm$^2$ per second for each laser head.

As shown in FIG. 2a and 2b, laser beam 14 is directed at a beam splitter or mirror 16 which is at least 99 percent reflective at a 45 degree angle of incidence for all polarizations of 1.06 micrometer wavelengths. The mirror 16 has a dielectric coating and is commercially available from Broomer Research of Plainview, N.Y.

A power monitor 18 is provided within the system for continuous indication of average developed laser power. The dielectric film beam splitter 16 transmits 1 percent of the beam 14 into this monitor 18 which may be a Quantronix Model 501 power detector, the output of which drives a Quantronix Model 504 indicator unit. This detector-indicator unit may further include a feedback unit to stabilize the power of the laser 12 in a manner well known in the art. The transmission of the optical system, hereinafter described, is carefully measured to provide a correction factor which, when applied to the absolute power measured on the indicator unit, gives a value for absolute power on the target to ±5 percent accuracy.

The beam 14 which is not directed to the power monitor 18 is reflected to a roof or dove prism 32. The roof prism 32 may be of a type which is commercially available from Rolyn Optical Company of Arcadia, Calif. The beam is reflected and proceeds through a 5.5-fold beam expander 42 which may be considered a reversed afocal Galilean telescope or a collimating telescope.

The beam emerging from the beam expander 42 is deflected by a right angle prism 44 which serves as a turning prism. The prism 44 may be similar to one available from Rolyn Optics, Part No. 40.0085. This prism is coated in the same manner as the roof prism 32. The deflected beam enters the beam homogenizer 45 which is designed to receive the incoming multimode beam and direct it to the "fast" wide-angle lens 46 which directs the image of the homogenizer output aperture 45 onto the workpiece or wafer. Suffice it to say and as will be appreciated by those skilled in the art, the flux density profile exiting the aperture of the cone-shaped homogenizer 45 is nearly rectangular with a substantially flat-top distribution and having sharply-defined edges. This flux distribution is now imaged onto the work surface by lens 46. Lens 46 is designed to receive and catch substantially all rays. Thus, the lens 46 must be "faster" (i.e. lower "f-number") than if the homogenizer 45 were not used. This image pulse will have a total power that will be below the point at which boiling of the wafer surface will occur but which may be above the melting point thereof.

In a practical application of the present invention in the field of wafer annealing, for a 12 watt $TEM_{00}$-mode laser focused to provide 3 joules per $cm^2$ at 10 Khz pulse rate in 0.170 millimeter diameter spots, a linear speed of 0.5 meter per second provides the suggested approximate 3-fold overlap (0.05 millimeter center-center spot spacing). This is achieved by rotation rates of 96 rpm at a radius of 7.6 centimeters (3 inches). This machine included the following specifications:

| Wafer Diameter | 3" |
|---|---|
| Laser Spot Spacing | 50μ |
| Annealing Intensity | 3 J/cm² approx. |
| Spot Diameter | 170μ |
| Pulse Duration | 100 nano sec. approx. |
| Laser Power cw | 12 watt $TEM_{00}$ |
| Pulse Rate | 15 Khz |
| Platen Rotation Speed | 48–96 RPM |
| Ω min–Ω max | |
| Batch Load | 9 3" wafers |
| Batch Time | 21 minutes |
| Radial Leadscrew Pitch | .020 inches |
| Radial Stepper Motor | 200 steps per revolution |

Figure 5:
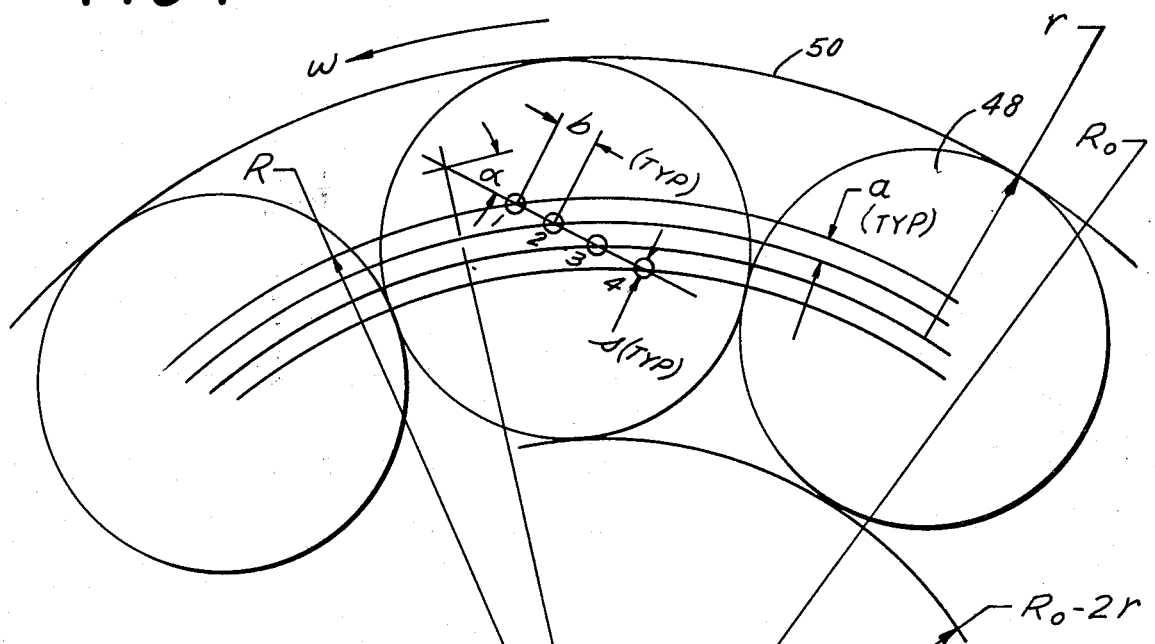
FIG. 5 is a plan view of a turntable including a plurality of semiconductor wafers.
Figure 4:
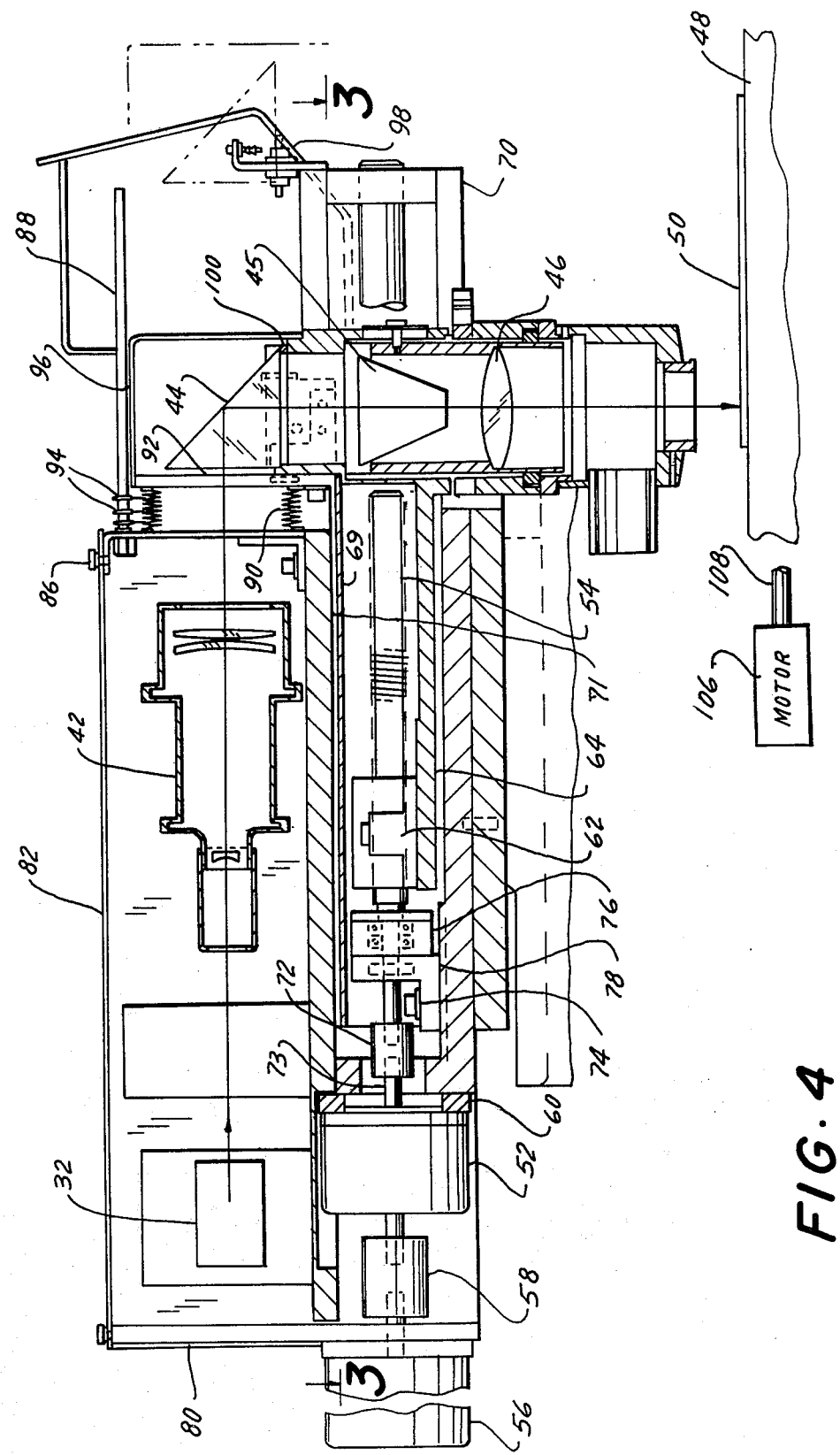
FIG. 4 is a sectional elevation view of the laser annealing system taken along line 4—4 of FIG. 3.

FIGS. 4 and 5 illustrate the laser scanning system including the mechanism by which the right angle prism, homogenizer, and focusing lens are positioned to provide uniform irradiation of the semiconductor wafers. The system comprises a stepper motor 52 and micrometer screw 54 combination. A return drive motor assembly 56 is also provided. Both motor assemblies 52, 56 are connected to a coupling 58. The stepping motor is secured to a motor mounting plate 60.

The stepper motor and micrometer screw provide slow radial motion. The motor is a standard 200 stepper-turn apparatus used with a fifty turn-per inch micrometer screw. This combination permits a radial step of 0.1 mil, which when synchronized with the angular position of the turntable 50 maintains an exact radial overlap.

The micrometer screw assembly 54 has a nut 62 which rides thereon as the screw turns. The nut 62 is secured to a movable carriage 64 which is supported by bearings 66. The bearings ride on a pair of shafts 68. A cover plate 69 and mounting plate 71 are positioned above the screw assembly. The base 70 is below it.

The screw 54 is actuated by the stepper motor 52. A shaft 73 extends from the motor to a coupling 72, and a second shaft 74 from the coupling to a bearing 76 secured to a bracket 78.

The optical components, including the roof prism 32, beam expander 42, right angle prism 44, homogenizer 45, and focusing lens assembly 46, are shown in their respective positions from the end plate 80. The top plate 82 is secured to a bulkhead plate 84 by a bolt 86, and a rod-shaped support bar 88 is attached to the upper portion of the bulkhead plate. A pair of bellows 90 are secured, respectively, to the bulkhead plate and bellows plate 92. The upper bellows are connected to the support bar 88 by rings 94. A right angle prism cover 96 shields the prism 44 from dust.

To indicate the position of the right angle prism 44 which is movable with respect to the motor, front and rear switch and bracket assemblies are provided. The prism is shown in the rear position of FIGS. 4 and 5. The front position is shown in phantom. The front switch and bracket assembly is designated by numeral 98 while the rear one is under a rod 68 in FIG. 4. The movable prism assembly 100 is able to reciprocate along rods 68 due to the provision of bearings 102 and retaining brackets 104.

In operation, the stepping motor causes rotation of the micrometer screw 54 at a desired speed. The screw nut 62 is able to ride on the screw, and causes movement of the carriage 64 towards the front. The carriage rides upon bearings 66 which are seated upon rods 68. As the carriage moves forward, it pushes the movable prism assembly 100 until it reaches the position shown in phantom in the drawings. The bellows 90 expand during the procedure.

Once the prism assembly 100 reaches the final position, the front switch 98 signals a microprocessor which directs the motor to rotate the screw in the opposite direction. Movement of the nut 62 towards the rear of the apparatus causes the carriage 64 and thereby the prism assembly to return to their original positions. The bellows 90 contract during this stage. (Alternatively, the turntable could move linearly instead of the prism assembly).

During the above procedure, it can be seen that the laser beams scan the semiconductor wafers along their radial dimensions. As the prism assembly moves in the radial direction, the wafer-bearing turntable 48 is driven by means of a reduction belt drive from a multi-pole synchronous motor 106. The AC-synchronous motor is driven by a locally-generated, frequency-controlled source ranging, for example, between 260 and 800 hz. (Such synchronous motors are readily available and are commonly used in military aerospace applications). A belt 108 serves as the means for actuating the turntable.

The linear speed of the scanning beams must be kept constant as the wafers are irradiated. Therefore, the angular speed of the turntable must be increased as the radius decreases to keep overlap of the spots constant. Towards this end, a micro-processor controller is provided which changes the speed of the turntable as a function of the radial position of the movable prism assembly 100 and carriage 64. It also determines the laser repetition frequency. Data input to the microprocessor is provided by digiswitches for the spot size (0.1 to 9.9 mil), radial and tangential overlap (1 to 99%), and the laser pulsing frequency (0.1 to 50.0 KHz). Input switches are provided for RUN, STOP, and a manual reset mode. The rotational and radial speeds are calculated by the controller.

Figure 6:
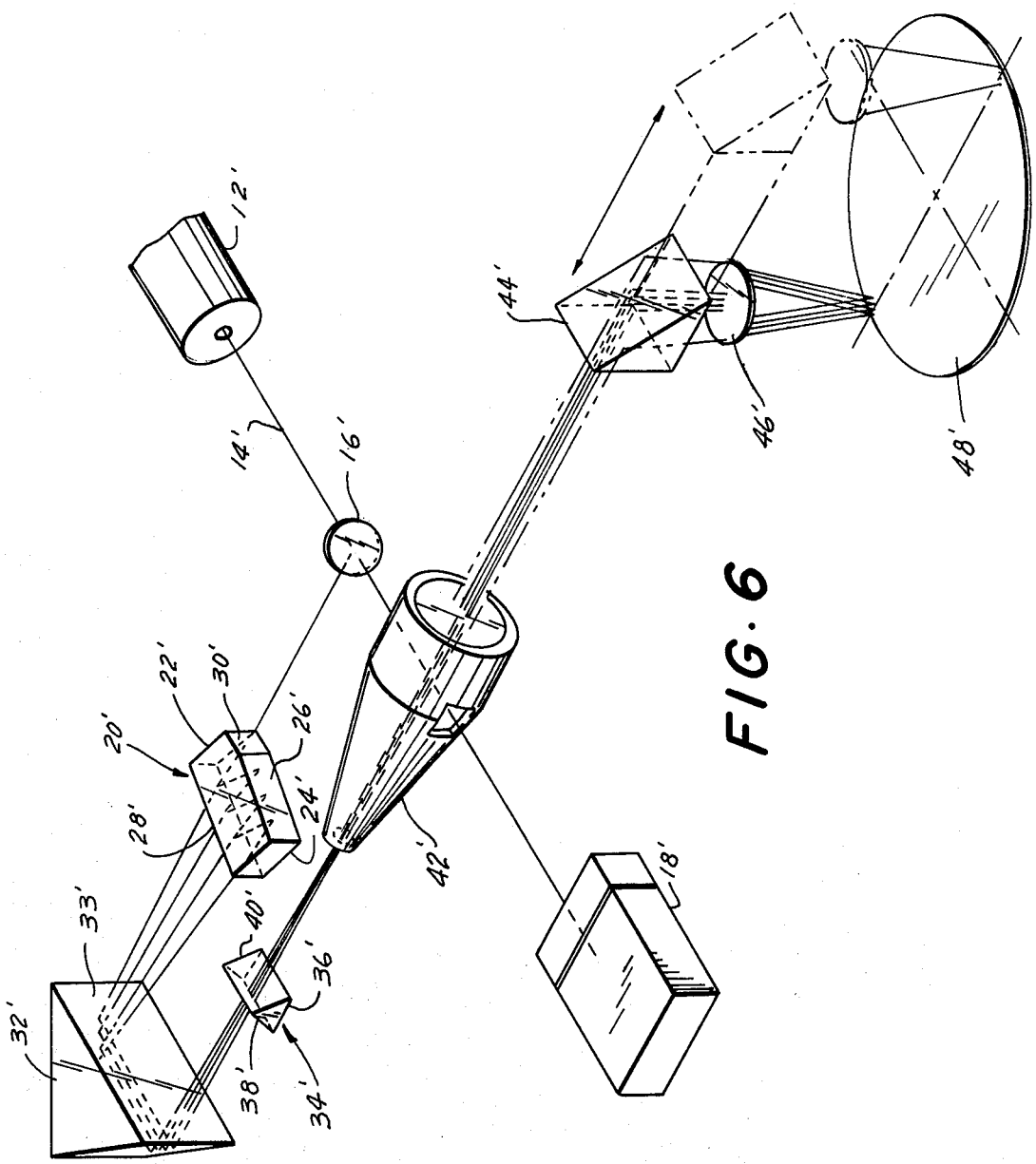
FIG. 6 is a schematic view of components of a laser gettering system.
Figure 7:
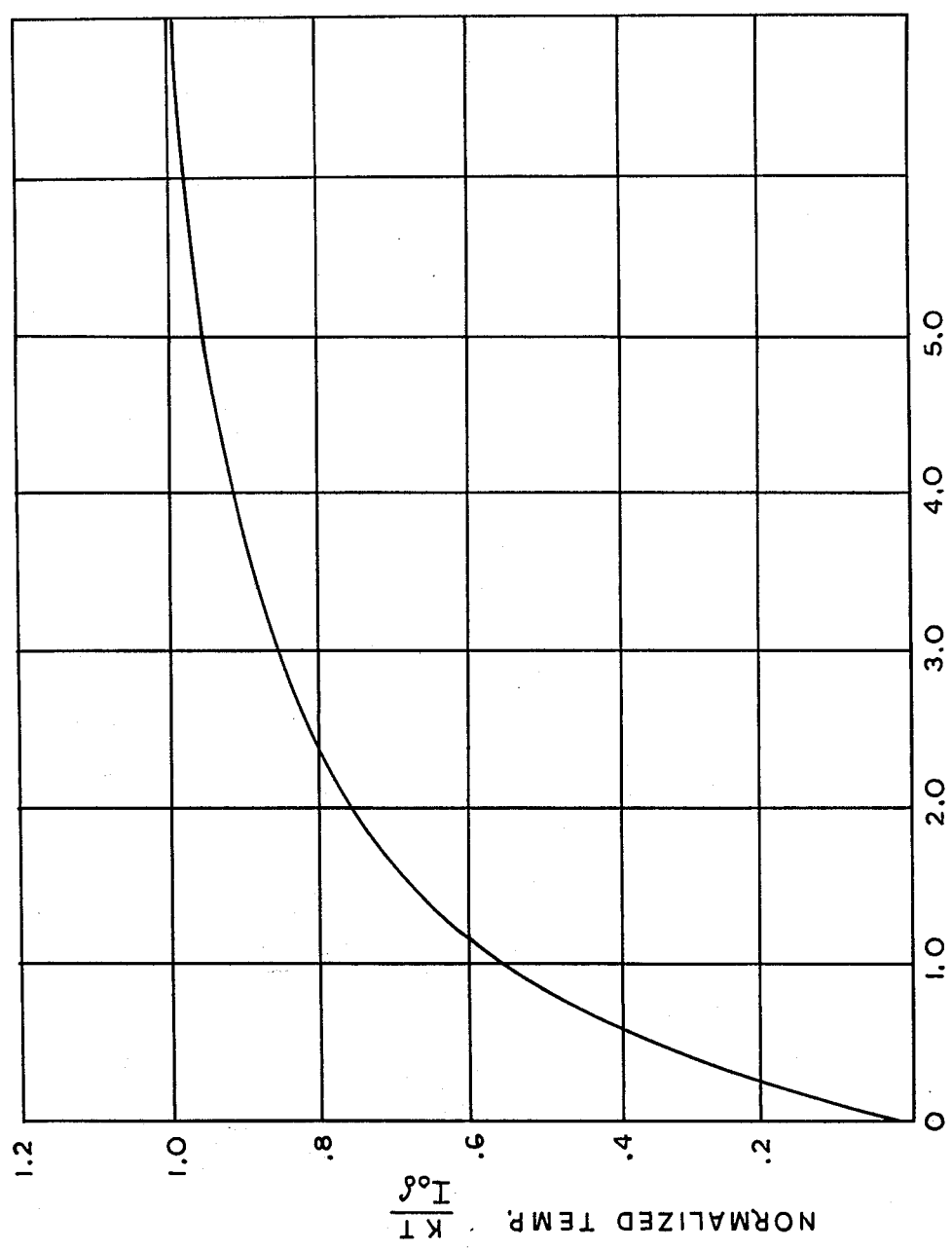
FIG. 7 is a graph showing normalized temperature as a function of pulse width.
Figure 8:
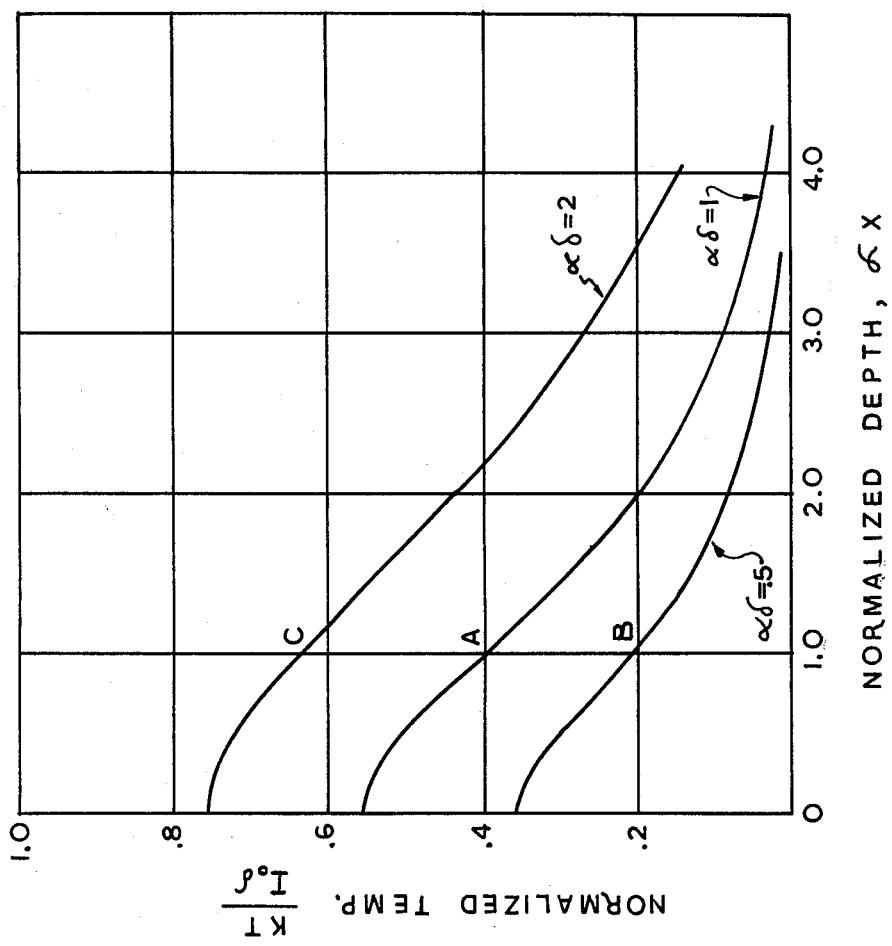
FIG. 8 is a graph of normalized temperature as a function of depth of pulse into the wafer.

In regard to the application of the present invention to gettering, wafers of silicon or the like or where there are parameter restrictions placed on spot size, reference is now made to the system schematically shown in FIG. 6. The laser 12' is a Model 117 multimode Nd:YAG Laser System available from Quantronix Corporation. It provides a rated (200 hour lamp life) output of one hundred watts with a $1/e^2$ beam diameter of 5 mm and a $1/e^2$ beam divergence of 8 mr. When used with a (Quantronix) Model 313 Q-switch, complete q-switch holdoff is achieved. The laser operates at a 1064 nanometer wavelength, and pulse duration falls between values of 100 to 300 nanoseconds. By exchange of the laser rod and adjustment of the mirror spacing, the system can also be operated to provide in excess of fifteen watts of beam power in the TEM$_{00}$ mode.

As shown in FIG. 6, a laser beam 14' is directed at a beam splitter or mirror 16' which is at least 99% reflective at a 45° angle of incidence for all polarizations of 1064 nanometer wavelengths. The mirror 16' has a dielectric coating and is commercially available from Broomer Research of Plainview, N.Y.

A power monitor 18' is provided within the system for continuous indication of average developed laser power. The dielectric film beam-splitter 16' transmits 1% of the beam 14 into this monitor 18' which may be a Quantronix Model 501 power detector, the output of which drives a Quantronix Model 504 indicator unit. This detector-indicator unit may further include a feedback unit to stabilize the power of the laser 12' in a manner well known in the art. The transmission of the optical system, hereinafter described, is carefully measured to provide a correction factor which, when applied to the absolute power measured on the indicator unit, gives a value for absolute power on the target to ±5% accuracy.

The 99% of the beam 14' which is not directed to the power monitor 18 is reflected to a beam divider prism 20' positioned about 74.7 mm from the center of beam splitter 16'. The beam divider prism 20' includes two parallel sides 22' and 24° which are 54 mm apart. The top 26' and bottom 28' are about 25.4 mm apart, and the bottom is angled towards the top by approximately 41.25 minutes. The angle is in the direction of the side 24' opposite the bevelled portion 30' provided in the upper side. The bevel extends for about 12.5 mm at a 15° angle.

The beam divider 20' comprises four glass rhombs. The first extends 18 mm from the first parallel side 22'. The second extends to 29.7 mm from this side 22' and the third a distance of 40 mm. The bottom surface of each rhomb is, respectively, 75% reflective at a 14° angle of incidence; 67% reflective at a 13° angle of incidence, 50% reflective at an 11° angle of incidence, and 0% reflective at a 10° angle of incidence. The laser beam is accordingly broken into four equal-power beams each travelling at a predetermined angle with respect to one another as the upper surface 26' is coated for nearly 100% reflection.

The optical surfaces of the prism beam divider 20' are polished to $\lambda/4$. The material utilized in its construction is crucible grade platinum-free BK-7 (boron silicate) available from Bourns Optical Glass of Watchung, N.J.

The four equal-power beams are next directed to a roof prism 32' located about 85.7 mm from the beam divider prism 20'. The direction of the beams is changed as shown and their orientation to each other is reversed. The roof prism 32 may be of a type which is commercially available from Rolyn Optical Company of Arcadia, Calif., part number 40.0095. It is polished flat to $\lambda/4$ and multilayer dielectric coated for less than 0.25% reflection of 1.06 mm laser light.

A rotatable delta prism 34' is positioned 51 mm from the large face 33' roof prism 32'. It has a base 36' which measures 14.26×25 mm and two side surfaces 38', 40' which extend diagonally 16.27 mm from the base. The base angles are each about 64°. The delta prism is composed of SF-56 (n=1.75463 at 1.064 mm), a well-known special glass available from Jener Glaswerk in West Germany. The first surface 38' is polished flat to one fringe, and AR coated, and transmits light of 1.064 mm for an angle of incidence of 26°. The second surface is polished flat and AR coated for a 14½° internal incidence angle. The base angle edges are beveled, and the base 36' is dielectric coated for 100% internal reflection of 1.064 μm light at a 78.5° angle of incidence (all polarizations).

The beams exit the delta prism after first bending as they pass through the first surface 38', reflecting from surface 36' and bending again as they exit surface 40'. They proceed to a 5.5-fold beam expander 42' positioned about 63.5 mm from the center of the delta prism 34'.

The beam expander 42' may be considered a reversed afocal Galilean telescope or a collimating telescope. Selection of the detailed parameters for the beam expander and other parts of the optical system offers a wide choice, and values ae given for these parameters only by way of example. The output of the beam expander is four beams each with an angular divergence of 1.5 mr travelling at an angle of 5 mr with respect to each other. The beam diameter is 27.5 mm. (If the TEM$_{00}$ mode system is utilized, the beam expander is replaced by a 2.5× beam expander).

The four beams emerging from the beam expander are deflected by a right angle prism 44' which serves as a turning prism. The prism 44' may be similar to one available from Rolyn Optics, part number 40.0085. It is coated in the same manner as the roof prism 32'. The beams are deflected into a 100 mm f/3.4 objective lens 46' to produce a pattern of focused spots as shown in FIG. 5. The spot size, s, is 0.15 mm and the separation b is 0.5 mm. Because the right angle prism 44 moves about 104 mm, the beam diameter at the aperture of the lens increases by 1.5 mm over the specified 27.5 mm, thus necessitating the f/3.4, 100 mm focal length objective. The angle $\alpha$ is about 8.5° to provide the proper overlap of spots. The values of b and $\alpha$ are chosen so that the target is never struck at the same time by overlapping spots. The angle $\alpha$ is adjusted by rotation of the delta prism and can be set by a dial. The targets are semiconductor wafers 48 and specifically the back surface thereof, each supported on shoulder-pin 5' positioned on a turntable 50.

In the case of a TEM$_{00}$ system, the beam expander described above is replaced by a 2.5× beam expander. The one millimeter laser beam diameter is expanded to 2.5 mm to produce a spot size, s, of 0.05 mm. The separation of beams is 10.7 mr so that b=1.08 mm. The angle $\alpha$ is set to provide the correct track-to-track spot overlap.

In FIG. 5, the following symbols are used to represent certain variables:
$\omega$ = turntable angular speed
a = track-to-track separation
R = instantaneous radius of the tracks
b = separation between adjacent spots
s = spot diameter
f = laser pulse rate
k = constant representing degree of overlap
r = radius of target wafers
$R_o$ = distance of outermost edges of wafers from center of turntable.

One will observe that the edges of the wafers are in contact with each other, and that their innermost edges are a distance of $R_o - 2r$ from the center of the turntable. The lines of centers of the target spots is inclined at angle $\pi/2-\alpha$ to the turntable radius. The spacing between tracks controls the overlap factor, and can be seen to be related to the angle $\alpha$ and spot spacing b by the relationship $a=b \sin \alpha +(\frac{1}{2}R)(b \sin \alpha)^2$. The value of a changes negligibly with R. the values of b and $\alpha$ can be chosen on the basis of other considerations, one of which is that b>s, a, so that the target 48' is never struck at the same time by overlapping spots. The spots are staggered so that before overlap occurs, the previous spot will have had time to cool for a period which is greater than the thermal memory. Rotation of the delta prism changes $\alpha$ thereby allowing radial proper overlap adjustment.

As explained above, the beam motion is provided by a single-axis stepper driven stage with 0.1 mil resolution. The rate is adjusted so that the pattern spirals inward on the turntable with the proper overlap. With four beam tracks as illustrated in FIG. 5, the total radial motion for each 360° of turntable motion must be equal to four times the track-to-track spacing. For example, if four spots are spaced three mils apart, the beam moves twelve mils for each revolution. Since, typically, the angular velocity of the turntable varies over the range 0.75 to 2.25 RPS, the stepping rate is 90 to 270 pps. The initial position is set within ±2 mils by an optical switch; actual position of the beam is stored in the controller memory relative to this position. As the turntable rotates, a radial step of 0.1 mil is commanded for each 3 degrees of turntable degrees rotation to provide a uniform motion with proper overlap.

The system cycle preferably begins with the radial motion assembly at the position of maximum radius against a limit switch. To initiate the cycle, the turntable speed is automatically brought to within ±5% of the initial angular speed. The laser beam is then released and the radial stepping is in synchronism with signals from an inexpensive, low-resolution encoder (e.g. eight bits) on the turntable shaft. Recalling the number of steps that the radial arm moves per revolution (e.g. 120), the accumulated radial arm steps are used by the controller to control the frequency of the turntable motor, accelerating it smoothly to $\omega_{max}$.

When the radial arm reaches minimum radius, the laser is shuttered, the turntable braked, and the prism assembly 100 is returned to its original position. The return stroke may take place at 6000$_{pps}$ (0.6$_{ips}$) and requires about seven seconds to traverse a maximum distance of four inches. No positional accuracy is required for this motion. Alternatively, a high-speed auxiliary motor for return may be used as shown by 56, FIG. 3.

The rotating table 50' mounts plattens of twelve inch diameter (holding six four-inch, nine three-inch, or fourteen two-inch target wafers). It rotates at 2.25 RPS (for minimum radius) to 0.75 RPS at the maximum radius. A rotary encoder with 1000 count resolution provides angular readout with 0.36 degree resolution for synchronization of the radial motion and control of rotational speed to hold the linear velocity constant. The angular velocity, $W_o$, as a function of radial position R is given by $$\omega_o = (ksf)/(R)$$

where k is the overlap factor, s is the diameter of individual spots and f is the laser pulse frequency. This value is continually updated by the controller and compared with the actual $\omega$ measured by the rate of encoder pulses to develop an error signal. The error signal is fed to the motor driver to control speed within the five percent necessitated by the overlap specification. Both the rotational speed and Q-switch frequency are referenced to the same oscillator so that the overlap tolerance is independent of errors in oscillator frequency.

It should be noted that the rate of change of turntable speed is very slow and is given, approximately by $$\frac{1}{\omega} \frac{d\omega}{dt} \approx \frac{2\alpha^2 f}{\pi R^2}$$

For $\alpha=10^{-3}$, R=2 inches, and f=$10^4$ hz, the fractional rate of change of turntable speed is about 0.2%/second. The speed must be held to ±5% to meet the overlap specification. Therefore the turntable speed control system response time needs only to be less than about twenty-five seconds for this example.

The above-described systems can easily be modified to permit selective irradiation of the various portions of the semiconductor substrates. This selective irradiation is accomplished by first preparing a set of blocking masks to be placed in contact (or near contact) with the semi-conductor wafer surface. These stencil-like masks block the passage of the laser beam except within those transmitting areas corresponding to the portions of the wafer surface desired to be irradiated. In this way, as the entire surface of the mask-wafer is scanned by the beam of the laser system mentioned above, only areas of the wafer lying under the transmitting portions of the masks are irradiated with the full intensity of the beam.

The masks can be made by a photolithographic process which, except for one difference, is the same as the process used to make the photomask used commonly in semiconductor fabrication. The glass mask-substrate, in fact, is the same as that used to make the IC photomask. In a preferred method of making the annealing mask, however, instead of silver halide emulsion or evaporated chrome for the opaque areas (as with IC photomasks), the non-transmitting areas consist of areas of the glass plate surface which have been etched by well-known methods (such as hydrofluoric acid solution) to form a "ground" or diffusing surface. Such diffusing surfaces will reduce the intensity of irradiation on the wafer surface below the threshold for the annealing process while at the same time presenting a virtually indestructible surface to the impinging beam. That is, the reduction in transmitted intensity stems from diffuse scattering rather than absorption or specular reflection. The diffuse reflectivity of etched areas can also be enhanced by filling them with inorganic ceramic powders. In use, the selectively "ground" side of the glass mask is placed in contact (or near-contact) with the wafer and aligned so that its clear and non-transmitting areas respectively lie over the corresponding areas of the wafer, and the whole (mask and substrate) then placed on the annealing system work surface. The annealing process proceeds as in the case of complete wafer-area coverage.

It has also been found that in certain applications the silicon wafer is preferably preconditioned to alter its absorption characteristics. In this connection, the band edge of absorption spectrum of the silicon wafer is temperature dependent. Thus, the band edge may be moved or shifted to change the absorption coefficient. Towards this end, the wafer absorption level in the neighborhood of 1 μm is increased by the application of heat prior to pulsing it with the selected laser. The Yag laser is ideally suited for a number of such contemplated applications. Because of its wavelength, a wide range of absorption coefficients are achievable by regulating temperature of the surface of the wafer. This preconditioning or supplemental heat may be from a suitable source such as a hot plate, hot air applicator, lamp 150 (FIG. b), or another laser wavelength.

It will be appreciated by those skilled in the art that modifications may be made in the above-described system without departing from the spirit of the invention. The numerical values given the various parameters which related to the invention are intended for illustrative purposes and are not limiting. Furthermore, the disclosed turntable can be replaced by an equivalent moving surface such as a ferris wheel type of unit without departing from the invention; and this expression "turntable" is intended to embrace such structures. The scope of the invention should be determined with reference to the appended claims.

What is claimed is:

1. A laser system for treating semi-conductor wafer material, comprising:
    a pulsed laser assembly for emitting a beam of sufficient power to treat the semi-conductor material;
    a surface upon which at least one semi-conductor target wafer may be placed;
    means for directing the beam from said laser assembly to said surface, the directing means including means for permitting the irradiated portions to cool before at least a portion of another beam strikes the same irradiated portion;
    means for providing relative rotational movement between said directed beam and said surface in order to irradiate selected portions of the surfaces of the wafers; and
    the means for permitting the irradiated portions to cool including means for emitting a plurality of beams in a staggered configuration with respect to one another such that when said means for providing relative movement is actuated, there is sufficient time for an irradiated spot to cool before at least part of another beam strikes the same irradiated spot.

2. The system as described in claim 1, wherein means are provided for controlling the rate of relative rotation so that the wafer is irradiated by the beam at the same relative linear speed at substantially all radial positions of irradiation relative to the axis of rotational movement.

3. A laser system for treating semi-conductor material, comprising:
    a pulsed laser assembly adapted to emit a beam of sufficient power to treat the semi-conductor material, said laser assembly including a beam divider for dividing said beam into a plurality of beams;
    a movable surface in the form of a turntable upon which a plurality of semi-conductor target wafers may be placed;
    means for directing said plurality of beams from said laser assembly to said turntable and the wafers thereon in order to irradiate selected portions of the surfaces of the wafers, the directing means including means for permitting the irradiated portions to cool before at least a portion of another beam strikes the same irradiated portion.

4. A method of inducing epitaxial regrowth of semi-conductor wafer material comprising the steps of:
    providing a movable turntable surface capable of supporting at least one semi-conductor wafer;
    directing a pulsed laser beam towards the movable surface for impingement upon the surface of the wafer to cause melting thereof to a level below the level of the crystalline host material of the wafer;
    moving said movable surface with respect to the laser beam such that the wafer is successively irradiated along predetermined areas of its surface;
    moving the laser beam radially with respect to the wafers positioned on the turntable as the turntable rotates; and
    controlling the rate of rotation of the turntable as a function of the radial position of the laser beam such that the beam moves at substantially the same linear speed with respect to the wafers as it irradiates said wafers.

5. A system as described in claim 3 wherein said directing means includes a means for staggering the beams with respect to one another such that when the beams strike the wafers as the movable surface moves, there is sufficient time for an irradiated spot to cool before at least part of another beam strikes the same irradiated spot.

6. A system as described in claim 5 wherein a rotatable delta prism is provided as a means for controlling the degree of staggering of the beams.

7. A system as described in claim 3 wherein said beam divider is a beam divider prism comprising a plurality of rhombs.

8. A system as described in claim 3 wherein said beam divider is adapted for receiving a beam from the laser assembly and dividing it into a plurality of beams of substantially equal power, a beam expander which receives the beams from the beam divider, and a turning prism which directs the beams to the movable surface.

9. A system as described in claim 8 further including in combination a roof prism which receives beams from the beam divider, and a rotatable delta prism which receives the beams from the roof prism and directs them to the beam expander.

10. A system as described in claim 3, wherein conditioning means are provided for conditioning the wafers to alter their absorption characteristics prior to irradiation by said laser assembly.

11. A system as described in claim 10, wherein the conditioning means is a source of heat.

12. A system as described in claim 3, wherein means are provided for moving said beam radially with respect to said turntable as said turntable rotates, and means are provided for controlling the rate of rotation of said turntable as a function of the radial position of said beam such that said beam moves at substantially the same relative linear speed with respect to the wafers as it irradiates said wafers.

13. A laser scanning system for annealing semiconductor material comprising:
    a pulsed laser assembly adapted for emitting a beam capable of annealing ion-implantation damage within semi-conductor material;
    a movable surface upon which a plurality of ion-implanted semi-conductor target wafers may be placed, the movable surface being a turntable;
    means for directing a beam from said laser assembly to said movable surface such that said wafers may be irradiated over desired positions of their respective surfaces;

means being provided for moving said beam radially with respect to said turntable as said turntable rotates, and means being provided for controlling the rate of rotation of said turntable as a function of the radial position of said beam such that said beam moves at substantially the same relative linear speed with respect to the wafers as it irradiates said wafers;

whereby said wafers may be batch processed as the movable surface moves the wafers as they are irradiated by the beam.

14. A system as described in claim 13, wherein the laser assembly is a Q-switched Yag laser having substantial beam stability, high average power and the ability to generate short pulses.

15. A system as described in claim 13, wherein the directing means includes means for permitting the irradiated portions of the wafers to cool before at least a portion of another beam strikes the same irradiated portions.

16. A method of treating semi-conductor wafers comprising the steps of:
providing a movable turntable surface capable of supporting a plurality of semi-conductor wafers;
positioning a plurality of semi-conductor wafers upon said movable turntable surface;
directing a laser beam towards said movable surface impinging upon said wafers, said beam being passed through a beam divider prior to its impingement upon said wafers such that a plurality of beams are directed towards said movable surface;
rotating said movable turntable surface with respect to the laser beam such that preselected surface areas of the wafers are successively irradiated; and
permitting the irradiated areas to cool before a portion of another beam strikes the same irradiated area.

17. A method as described in claim 16 further including the step of staggering the spots where the beam contacts the movable surface in such a manner that at least one spot will overlap at least a portion of a previously irradiated spot, the stagger allowing said previously irradiated spot to cool before overlapping occurs.

18. A method as described in claim 17 further including the step of adjusting the angle at which the spots are staggered by passing the beams emerging from the beam divider through a rotatable delta prism.

19. A method as described in claim 16, wherein the wafers are preconditioned to alter their absorption characteristics prior to directing the laser beam thereon.

20. A method as described in claim 19, wherein the wafers are preconditioned by applying heat thereto.

21. A method of annealing semi-conductor wafers comprising the steps of:
providing a movable surface capable of supporting a plurality of semi-conductor wafers, the movable surface being a turntable which rotates as the laser beam is directed thereon;
positioning a plurality of semi-conductor wafers upon said movable surface;
directing a pulsed laser beam towards said movable surface capable of annealing damage within said wafers;
moving said movable surface with respect to the laser beam as the laser beam is directed thereon such that each of the wafers is successively irradiated;
moving the laser beam radially with respect to the wafers positioned on the turntable as the turntable rotates; and
controlling the rate of rotation of the turntable as a function of the radial position of the laser beam such that the beam moves at substantially the same linear speed with respect to the wafers as it irradiates said wafers.

22. The method as described in claim 21 wherein the laser beam is a multi-mode beam of relatively high power that is directed to a beam homogenizer and thereafter passed through a wide angle lens which images the output of the homogenizer on the wafer.

23. A method as described in claim 21 further including the step of positioning a blocking mask near at least one of said wafers, said blocking mask blocking the passage of the laser beam except within certain transmitting areas within said mask.

24. The method as described in claim 21 including the step of permitting the irradiated areas to cool before a portion of another beam strikes the same irradiated area.

25. A method of treating semi-conductor wafers comprising the steps of:
providing a surface capable of supporting at least one semi-conductor wafer;
placing at least one semi-conductor wafer upon said surface;
directing a plurality of pulsed laser beams towards said surface in a staggered configuration to irradiate said wafer in such a manner that at least one spot overlaps at least a portion of a previously irradiated spot, the stagger allowing said previously irradiated spot to cool before overlapping occurs;
causing relative rotational movement between said surface and said beams such that said wafer is irradiated along predetermined areas of its surface.

26. A method as described in claim 25, wherein providing for control rates of relative rotation so that the wafer is irradiated by the beam at the same relative linear speed at substantially all radial positions of irradiation relative to the axis of rotational movement.

27. A method as described in claim 25 further including the step of adjusting the angle at which the spots are staggered by passing the beams through a rotatable delta prism.

28. A method as described in claim 25 wherein said beam causes melting of the surface of said wafer to a level below the level of a crystalline host material of said wafer.

* * * * *